(12) United States Patent
McCarthy

(10) Patent No.: US 6,271,744 B1
(45) Date of Patent: Aug. 7, 2001

(54) CURRENT SENSING ARRANGEMENT WITH ENCIRCLING CURRENT-CARRYING LINE AND FERROMAGNETIC SHEET CONCENTRATOR

(75) Inventor: Michael C. McCarthy, Birmingham, MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/517,988

(22) Filed: Mar. 3, 2000

(51) Int. Cl.[7] .................................................. H01L 43/00
(52) U.S. Cl. .................... 338/32 H; 324/117 H; 324/124; 324/207.2
(58) Field of Search ................... 338/32 H, 32 R; 324/117 H, 126, 207.2, 207.21, 207.15, 263

(56) References Cited

U.S. PATENT DOCUMENTS

| | | |
|---|---|---|
| 4,584,552 | 4/1986 | Suzuki et al. . |
| 4,613,843 * | 9/1986 | Esper et al. ........................ 336/232 |
| 4,772,929 | 9/1988 | Manchester . |
| 4,893,073 * | 1/1990 | McDonald et al. ............... 324/117 H |
| 4,939,448 * | 7/1990 | Gudel ............................... 324/117 H |
| 5,041,761 * | 8/1991 | Wright et al. ........................ 315/129 |
| 5,241,263 * | 8/1993 | Naoi et al. ........................ 324/117 H |
| 5,247,278 | 9/1993 | Pant et al. . |
| 5,572,177 * | 11/1996 | Fujiwara ............................... 335/132 |
| 5,883,567 | 3/1999 | Mullins, Jr. . |
| 5,917,401 * | 6/1999 | Smith et al. ............................ 338/49 |
| 5,942,895 | 8/1999 | Popovic et al. . |
| 6,005,383 * | 12/1999 | Savary et al. .................... 324/117 H |
| 6,130,599 * | 10/2000 | Juds et al. ........................... 338/32 H |

OTHER PUBLICATIONS

Jiles, David "Intro. to Magnetism and Magnetic Materials", pp. 274–282, Chapman & Hall (1991).*

* cited by examiner

Primary Examiner—Karl D. Easthom
(74) Attorney, Agent, or Firm—Tarolli, Sundheim, Covell, Tummino & Szabo L.L.P.

(57) ABSTRACT

A current sensing arrangement (10) includes a Hall effect sensor (16). A current-carrying line (14) of the arrangement (10) encircles the Hall effect sensor (16). A ferromagnetic sheet material (32) of the arrangement (10) covers a portion of the current-carrying line (14) and a portion of the Hall effect sensor (16).

13 Claims, 5 Drawing Sheets

US 6,271,744 B1

CURRENT SENSING ARRANGEMENT WITH ENCIRCLING CURRENT-CARRYING LINE AND FERROMAGNETIC SHEET CONCENTRATOR

FIELD OF THE INVENTION

The present invention relates to arrangements for current sensing via use of the Hall effect, and is particularly directed to an arrangement that provides heightened sensitivity while utilizing a low-cost Hall effect sensor.

BACKGROUND OF THE INVENTION

It is known to sense the current flowing through a line by sensing the magnetic field that is generated by the current flow. One known technique for sensing the magnetic field, and thus sensing the current, is to utilize a Hall effect sensor. The Hall effect sensor is placed in close proximity to the current-carrying line such that the magnetic field that permeates the space in the vicinity of the line also permeates the Hall effect sensor.

Strength of the magnetic field (i.e., the magnetic flux value) is dependent upon the current size flowing through the current-carrying line. In order for the Hall effect sensor to accurately perceive very small current flow values, the sensor must have a relatively high sensitivity for the magnetic field. A Hall effect sensor that has a relatively high sensitivity often has a higher cost.

SUMMARY OF THE INVENTION

In accordance with one aspect, the present invention provides a current sensing arrangement that includes a Hall effect sensor. A current-carrying line encircles the Hall effect sensor. A ferromagnetic sheet material covers a portion of the current-carrying line and a portion of the Hall effect sensor.

In accordance with another aspect, the present invention provides a current sensing arrangement that includes means for sensing a current via magnetic field sensing and for providing an output indicative of the amount of sensed current. Means provides a current that encircles the means for sensing, and the provision of the current causes an output of a magnetic field. Means concentrates the magnetic field output from the means for providing a current to the means for sensing via transmission through a ferromagnetic sheet material.

BRIEF DESCRIPTION OF THE DRAWINGS

The foregoing and other features and advantages of the present invention will become apparent to those skilled in the art to which the present invention relates upon reading the following description with reference to the accompanying drawings, wherein.

DESCRIPTION OF PREFERRED EMBODIMENTS

Figure 1:
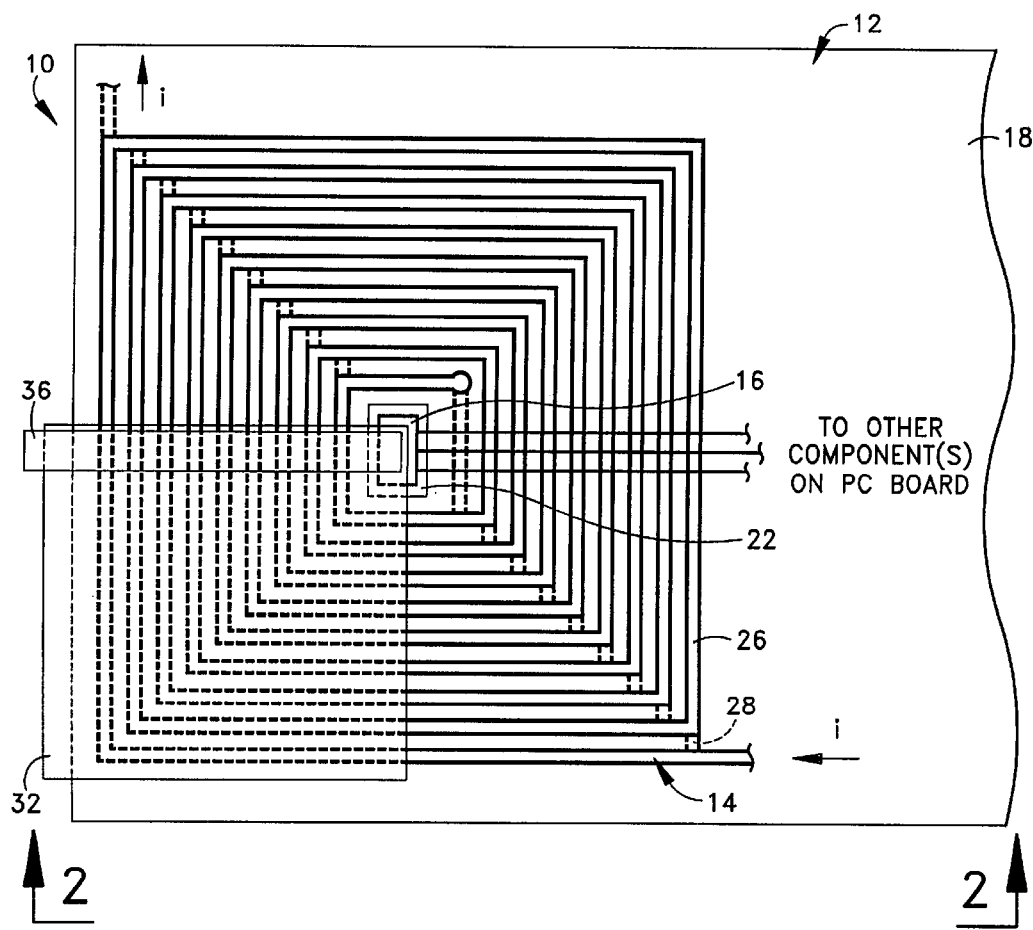
FIG. 1 is a plan view of a current sensing arrangement in accordance with a first embodiment of the present invention.

One embodiment of a current sensing arrangement 10, in accordance with the present invention, is shown in FIG. 1. The current sensing arrangement 10 is configured on a printed circuit (hereinafter "PC") board 12 that typically contains components (not shown) that are not part of the current sensing arrangement.

The arrangement 10 includes a current-carrying line 14 through which a current i flows, and a Hall effect sensor 16 that senses a magnetic field (i.e., magnetic flux) caused by the current flow through the line. The sensed magnetic field is indicative of the amount of current flow i through the line 14. It is to be appreciated that the current-carrying line 14 is part of a circuit (other parts of the circuit not shown) that performs some function in association with the flow of current through the line. Thus, in part, the current sensing arrangement 10 is provided to sense the amount of current flow through the current-carrying line 14 during performance of the function by the circuit.

The PC board 12 (FIG. 2) has first and second parallel, planar surfaces 18 and 20. An aperture 22 (hole) extends through the PC board 12 from the first surface 18 to the second surface 20. The Hall effect sensor 16 is fixed (e.g., via adhesive) at a location within the aperture 22. The Hall effect sensor 16 is operatively connected to components (not shown) on the PC board 12 that provide power to the Hall effect sensor and that monitor an output of the Hall effect sensor that is indicative of sensed current. For example, the Hall effect sensor 16 has three connection leads (FIG. 1). A first lead is connected to electrical ground, a second lead is connected to a power source (e.g., 5V DC), and a third lead conveys a voltage output indicative of sensed current.

Preferably, the Hall effect sensor 16 is a low-cost sensor device. Although it is contemplated that the arrangement 10 in accordance with the present invention can utilize a Hall effect sensor that has relatively low sensitivity, the embodiment shown in FIG. 1 utilizes a sensor that has a relatively high sensitivity (e.g., 5 mV/gauss) for maximizing performance of the arrangement. In one embodiment, the Hall effect sensor 16 is a sensor identified as A3515 and manufactured by Allegro Microsystems, Inc. The quiescent output of the Hall effect sensor 16, measured at zero gauss, is nominally one-half of the input power voltage. In the illustrated example, the quiescent output is 2.5V with the input voltage being 5V. The quiescent voltage then swings above or below 2.5V, depending on the plurality of an imposed magnetic field, at a rate of 5 mV/gauss.

Turning to the current-carrying line 14, the line is positioned to surround/encircle the Hall effect sensor 16. In the illustrated embodiments, the encircling of the Hall effect sensor 16 is via positioning of the current-carrying line 14 to radially spiral around the Hall effect sensor in at least one plane that lies parallel to the planar surfaces 18, 20 of the PC board 12. The term radially means each successive turn increases or decreases in radius with respect to a central point or immediately preceding turn. Preferably, the current-carrying line 14 has a plurality of spiral coils around the Hall effect sensor 16. In the illustrated embodiments, the spiral coils of the current-carrying line 14 are provided as a spiraling conductive trace located on at least one printed circuit board foil.

Also, in the illustrated examples, the coils of the current-carrying line 14 have a squared-off configuration. However, it is to be appreciated that other constructions and configurations of the current-carrying line 14 are possible. For example, the spiral coils may have another shape such as a smooth, rounded shape.

Figure 2:
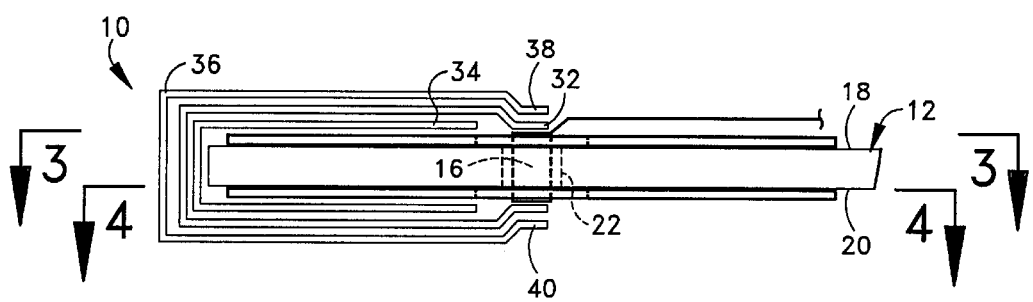
FIG. 2 is a view taken along line 2—2 of FIG. 1.
Figure 3:
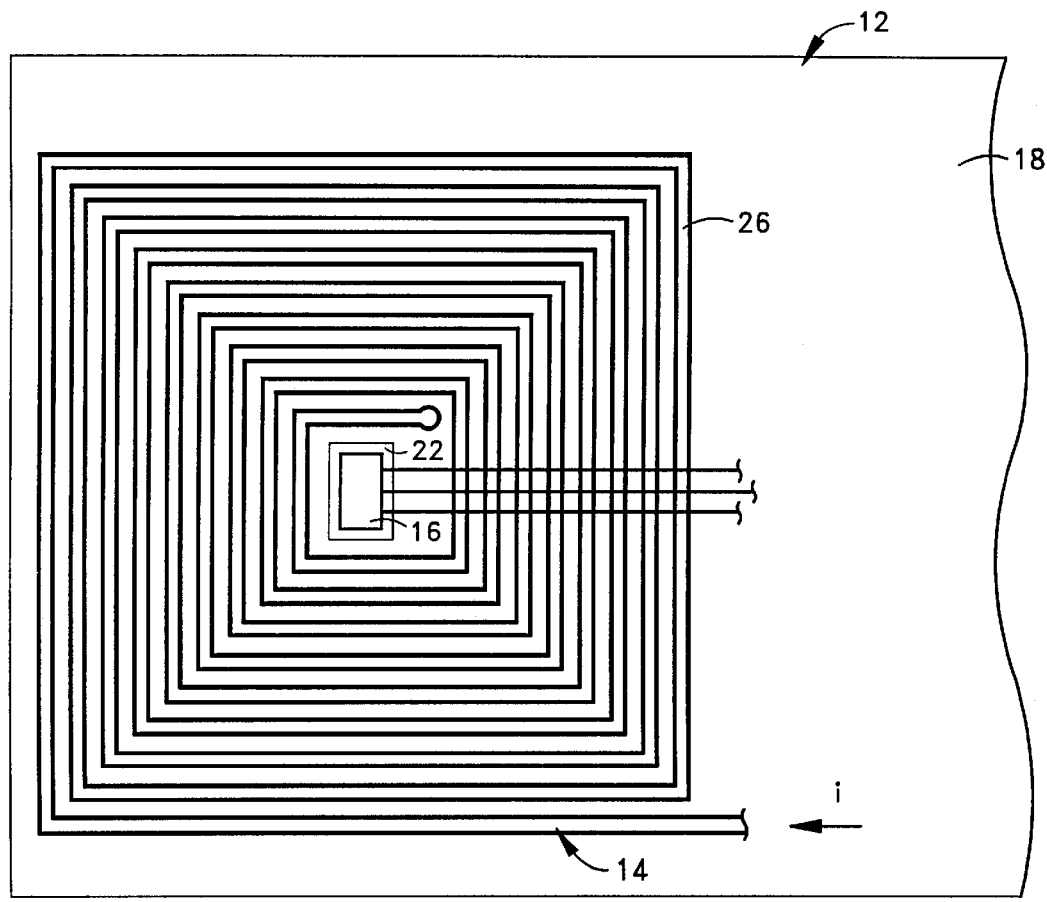
FIG. 3 is a view taken along line 3—3 of FIG. 2, with certain parts removed and certain hidden structure not illustrated.
Figure 4:
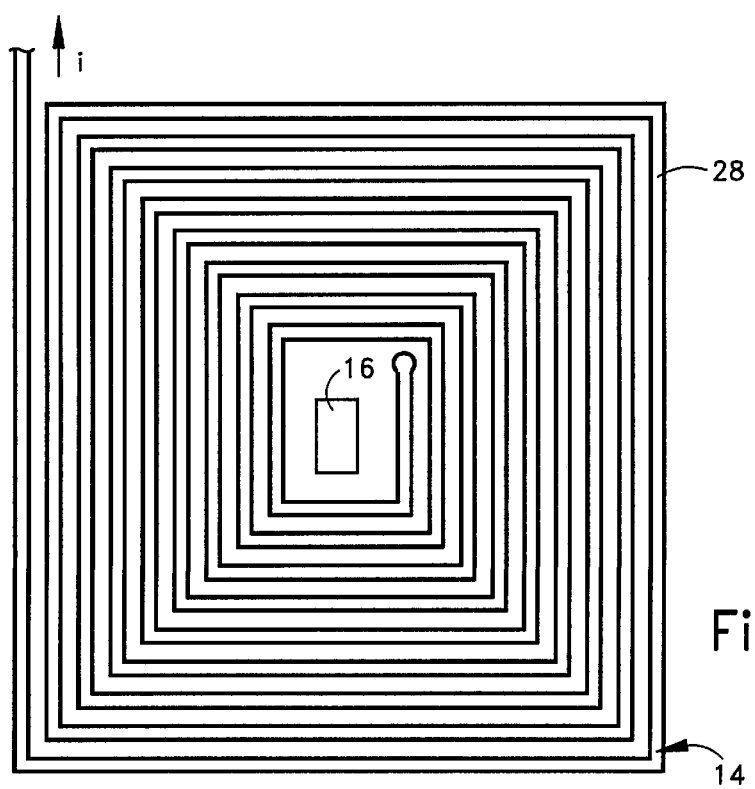
FIG. 4 is a view taken along line 4—4 of FIG. 2, with certain parts removed.

Preferably, the spiral coils of the current-carrying line 14 are provided in first and second portions 26 and 28 (FIGS. 3 and 4, note that certain structures of the apparatus are not shown). The first portion 26 (FIG. 3) of the spiral coils is provided via a first printed circuit board foil located adjacent to the first surface 18 of the PC board 12. The second portion 28 (FIG. 4) of the spiral coils is provided via a second printed circuit board foil that is located adjacent to the second surface 20 (FIG. 2) of the PC board 12. Accordingly, part of the PC board 12 is sandwiched between the first and second foils that contain the first and second portions 26 and 28 of the spiral coils. Each of the foils has a center opening at the location of the aperture 22 through the PC board 12 and thus at the location of the Hall effect sensor 16.

The spiral coils of both the first and second portions 26 and 28 extend around the Hall effect sensor 16 that is located within the aperture 22 of the PC board 12. The first portion 26 of spiral coils (i.e., on the foil adjacent to the first surface of the PC board) begins at an outer periphery of the first foil, spirals inwardly, and terminates adjacent to the Hall effect sensor 16 (i.e., adjacent to the center of the spiral). It is to be appreciated that the definitions of the beginning and terminating ends of the spiral coil is for identification only and are selected herein based upon current flow i through the current-carrying line 14. In the illustrated example, the inward spiraling of the first portion is clockwise.

The beginning of the second portion of the spiral coils is located adjacent to the Hall effect sensor 16 and beneath (as viewed in FIG. 1) the end of the first portion of coils. The beginning of the second portion 28 of the spiral coils is electrically connected to the end of the first portion 26 of the coils by a metallic connector element (not visible) that extends through the printed circuit board, from the first surface 18 to the second surface 20.

The second portion 28 (FIG. 4) of spiral coils spirals outwardly and terminates adjacent to an outer periphery of the second foil. It should be noted that with the use of two portions 26 and 28 (FIGS. 3 and 4) of encircling spiral coils, the spiraling of the two portions are in the same direction (e.g., both clockwise) such that a magnetic field (i.e., flux) emitted by the first portion is complementary with a magnetic field (flux) emitted by the second portion.

The location of the Hall effect sensor 16 encircled by the current-carrying line 14 provides that the Hall effect sensor is subject to the magnetic field caused by the current flow i. In order to concentrate the magnetic field output by the spiraling coils at the Hall effect sensor 16, the arrangement 10 includes a ferromagnetic sheet material 32 (shown only in FIGS. 1 and 2, omitted from FIGS. 3 and 4) that extends across a portion of the current-carrying line 14 and a portion of the Hall effect sensor 16. In the illustrated example, the ferromagnetic sheet material 32 extends across (i.e., overlies) approximately a quarter of the first coil portion 26 on the first surface 18 of the PC board 12, is wrapped to the second surface 20 of the PC board 12, and extends across approximately a quarter of the second portion 28 of the coils located on the second surface of the PC board.

The ferromagnetic sheet material 32 may be any suitable material that concentrates magnetic flux. For example, the sheet material may be a material that has a high permeability and has a low coercive force. In one example, the material is comprised of soft magnetic nickel iron alloy. Common industry names for such a material include Mu-metal, Permalloy, and Molypermalloy.

Turning to the placement of the ferromagnetic sheet material 32, the sheet material preferably contacts the Hall effect sensor 16 (shown spaced in FIG. 2 for illustrative purposes only) for maximum transmission of concentrated magnetic flux to the Hall effect sensor. Also, preferably, the ferromagnetic sheet material 32 does not contact the current-carrying line 14 to prevent shorting. Accordingly, a sheet of electrically insulating material 34 (shown only in FIG. 2, omitted from FIGS. 3 and 4) is disposed between the segments of the current-carrying line 14 that are overlaid by the ferromagnetic sheet material 32.

In the illustrated embodiment, the insulating sheet material 34 extends across a portion of the first surface 18 of the PC board 12 that contains the overlaid segments of the current-carrying line 14, is wrapped around to the second surface 20 of the PC board, and extends across the portion of the current-carrying line that is overlaid on the second surface of the PC board. In one embodiment, the insulating sheet material 34 may be in the form of an adhesive tape. It is to be appreciated that, although the insulating sheet material is shown in the embodiment as being a separate sheet, electrical insulation may be provided by an insulating layer that is merely adhered to the foils that contain the coils of the current-carrying line 14.

In order to maintain the positional arrangement of the ferromagnetic sheet material 32, and if necessary, the insulating sheet material 34, with respect to the Hall effect sensor 16 and the coils of the current-carrying line 14, the illustrated embodiment includes a retaining clip 36 (shown only in FIGS. 1 and 2, omitted from FIGS. 3 and 4). The retaining clip 36 has a portion that extends along the first surface 18 of the PC board 12, a bent portion, and a portion that extends along the second surface 20 of the PC board.

Two feet 38 and 40 of the retaining clip 36 press appropriate segments of the ferromagnetic sheet material 32 into direct contact with the Hall effect sensor 16 (spacing is shown in FIG. 2 for illustrative purposes only). It is to be appreciated that the ferromagnetic sheet material 32, and if necessary, the insulating sheet material 34 may be held in place with regard to the Hall effect sensor 16 and the current-carrying line 14 by other suitable means.

The overall size of the arrangement 10 is dictated for the most part by the size of the foils that contain the spiral coiling current-carrying line 14. In one example, the overall size of the arrangement 10 occupies approximately one square inch of PC board area.

Turning to the issue of the amount of current that may flow through the current-carrying line 14, the current-carrying capacity of the line is dependent upon the cross-sectional area of the current-carrying line. Particularly, because the current-carrying line 14 of the embodiment shown in FIG. 1 is a trace on a printed circuit board foil, the current capacity is understandably limited. Increasing the cross-sectional area of the current-carrying line 14 can accommodate an increase in current capacity.

Figure 6:
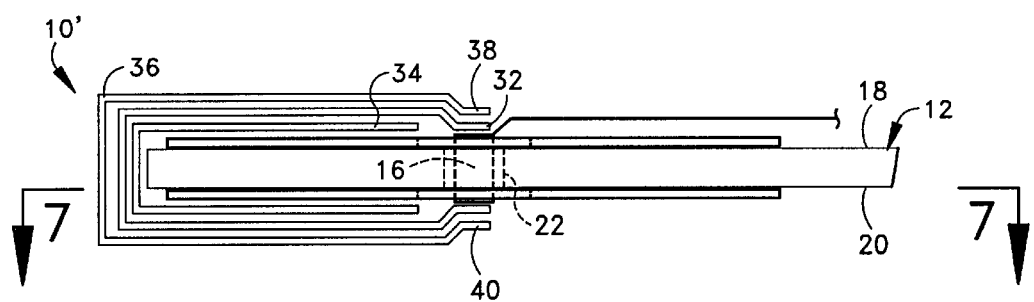
FIG. 6 is a view taken along line 6—6 of FIG. 5.
Figure 7:
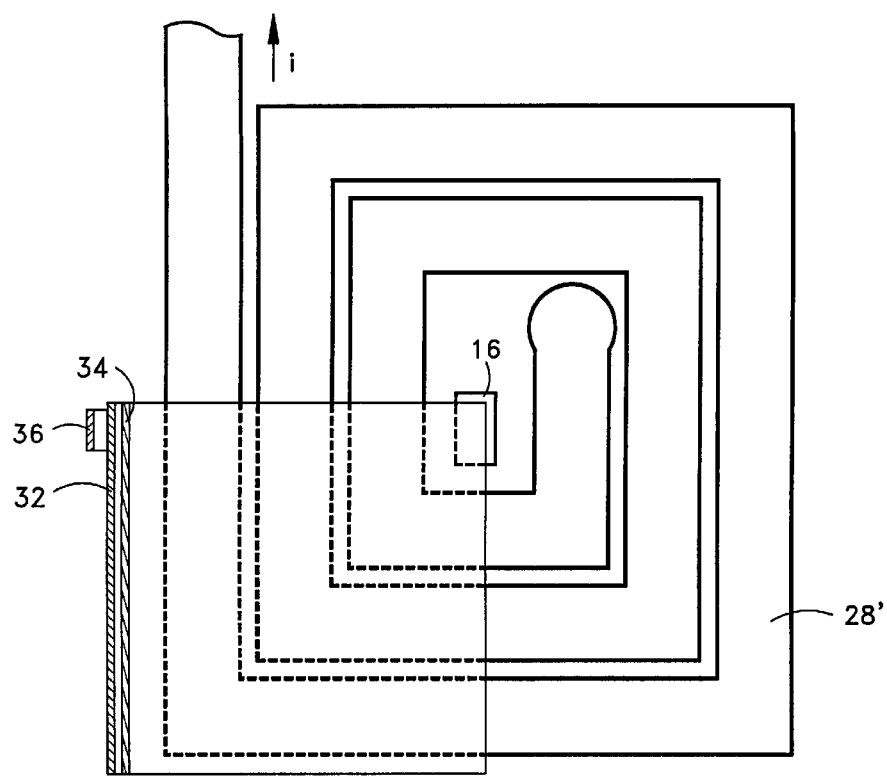
FIG. 7 is a view taken along line 7—7 of FIG. 6.

For printed circuit board foils, an increased carrying capacity of the current-carrying line 14 is accomplished by a wider trace on the foil for the line. For example, see the embodiment shown in FIGS. 5–7, which is similar to the embodiment shown in FIGS. 1–4. Many of the structures for the embodiments are identical and, accordingly, identical reference numerals are used for the identical structures.

Briefly, the difference between the first and second embodiments is directed to the current carrying line (i.e., the traces on the foils). As one aspect, the second embodiment has a larger trace width for its current-carrying line 14'. The first portion 26' (FIG. 5) of the coils and the second portion 28' (FIG. 7) of the coils each have much wider traces compared to the embodiment shown in FIGS. 1–4.

It is to be appreciated that the current range that can be measured by the current sensing arrangement (e.g., 10) in accordance with the present invention is related to the total number of coil turns around the Hall effect sensor 16. In order to sense a low range of currents, a greater number of coil turns is required to generate a sufficiently large magnetic field (e.g., a magnetic field that is equivalent to the field that would be generated by a higher current flowing through less coil turns). In the embodiment shown in FIGS. 1–4, the first portion 26 of coils of the current-carrying line 14 has 8.5 turns and the second portion 28 of coils has 8.5 turns. However, one advantage associated with a small size current-carrying line (i.e., a narrow trace with a small cross-section) for low-level current flow, is that the required area on the PC board for the arrangement does not necessarily expand in proportion to the number of coil turns.

Figure 5:
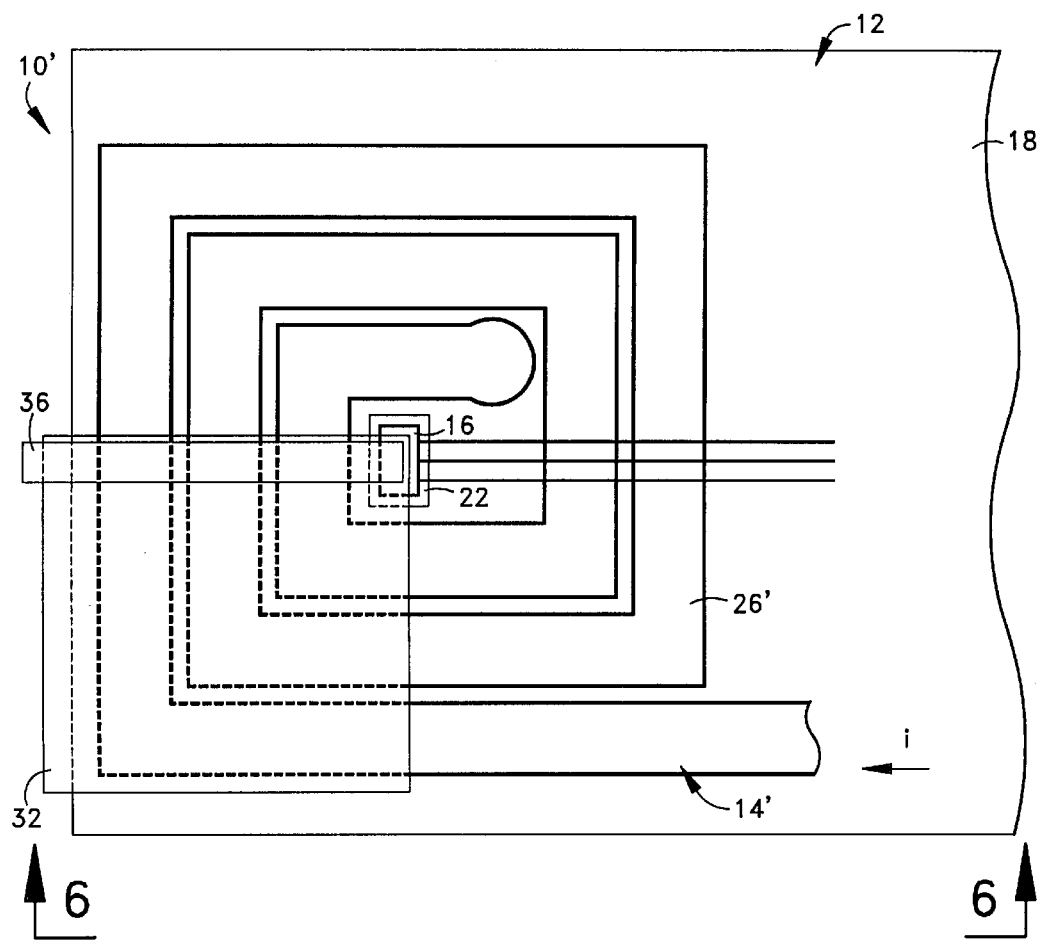
FIG. 5 is a plan view of a second embodiment in accordance with the present invention, with certain hidden structure not illustrated.
Figure 8:
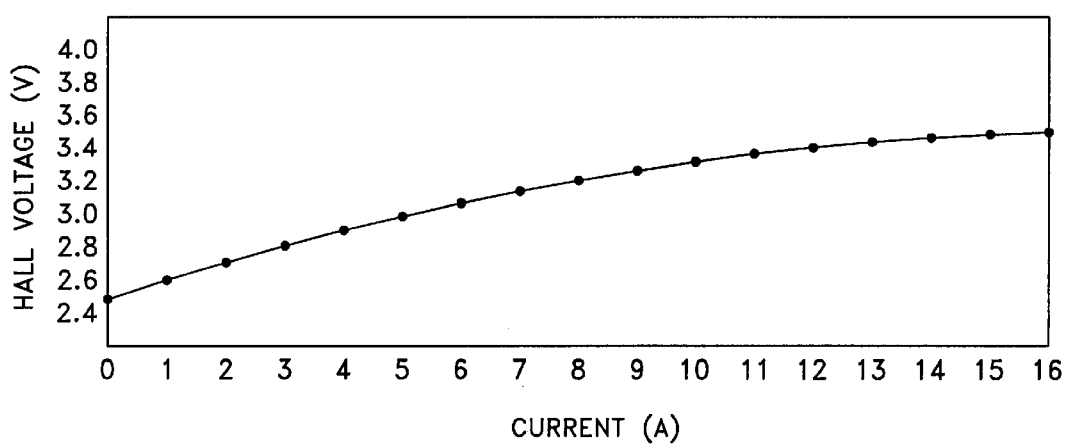
FIG. 8 is a plot of Hall voltage output based upon current flow for the embodiment shown in FIGS. 5–7, with a first concentrator sheet thickness.

Turning again to the embodiment shown in FIG. 5, the first portion 26' of the coils of the current-carrying line 14' has 2.5 coil turns and the second portion 28' has 2.5 coil turns. In one example, the area size of each foil that provides the coils is approximately 1 square inch, the trace of the current-carrying line 14' has a width of 0.12 inches, and the ferromagnetic sheet material 32 has a thickness of 0.005 inches. The quiescent voltage increases from 2.5V to 4.0V at a current of 16 amps. The performance characteristics of the embodiment are set forth by the following table and are illustrated within FIG. 8.

TABLE I

| Current (A) | Hall Voltage (V)<br>0.005" thickness |
|---|---|
| 0 | 2.48 |
| 1 | 2.578 |
| 2 | 2.679 |
| 3 | 2.789 |
| 4 | 2.883 |
| 5 | 2.97 |
| 6 | 3.046 |
| 7 | 3.125 |
| 8 | 3.194 |
| 9 | 3.247 |
| 10 | 3.304 |
| 11 | 3.347 |
| 12 | 3.39 |
| 13 | 3.424 |
| 14 | 3.454 |
| 15 | 3.48 |
| 16 | 3.504 |

Figure 9:
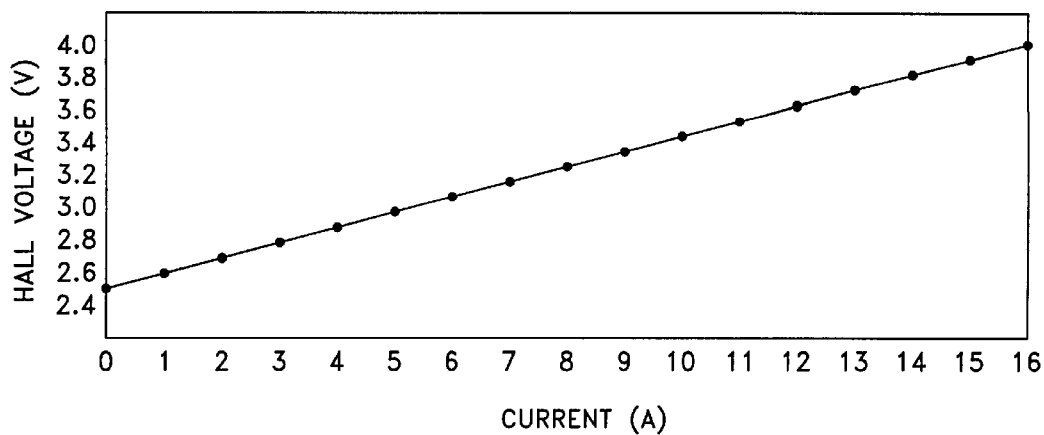
FIG. 9 is a view similar to FIG. 8, but for a second concentrator sheet thickness.

It should be noted that saturation of the ferromagnetic sheet material 32 begins to occur toward the higher current values. The saturation provides a slight roll-off. In order to increase the available saturation level, the thickness of the ferromagnetic sheet material 32 can be increased. For example, use of a ferromagnetic sheet material that has a thickness of 0.015 inches produces values shown in the following table and plotted on FIG. 9.

TABLE 2

| Current (A) | Hall Voltage (V)<br>0.015" Permalloy |
|---|---|
| 0 | 2.491 |
| 1 | 2.564 |
| 2 | 2.658 |
| 3 | 2.76 |
| 4 | 2.865 |
| 5 | 2.958 |
| 6 | 3.056 |
| 7 | 3.155 |
| 8 | 3.252 |
| 9 | 3.35 |
| 10 | 3.45 |
| 11 | 3.546 |
| 12 | 3.646 |
| 13 | 3.737 |
| 14 | 3.833 |
| 15 | 3.945 |
| 16 | 4.024 |

Figure 10:
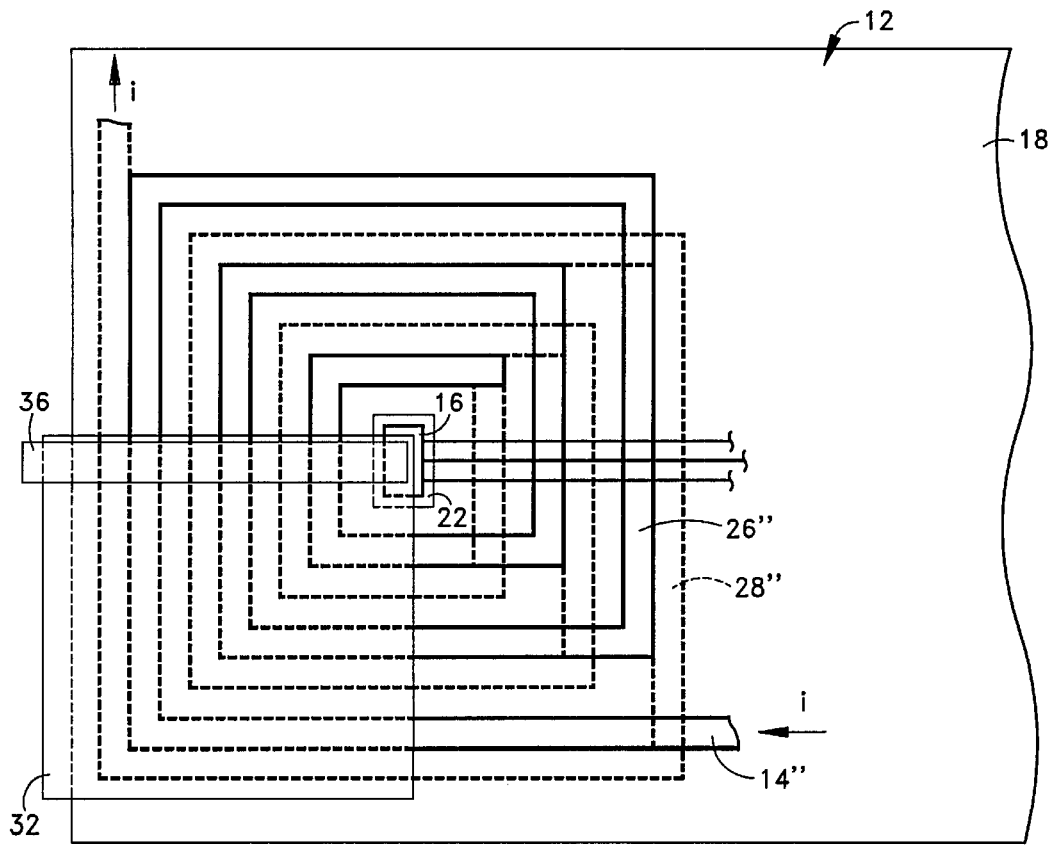
FIG. 10 is a plan view of a third embodiment in accordance with the present invention.

It is to be appreciated that the first and second spiral coil portions (e.g., 26 and 28, FIG. 1) shown within the first two embodiments essentially overlay each other when viewed along a direction orthogonal to the PC board 12. It should be appreciated that overylaying coils are not essential to the operation of the present invention. For example, in the embodiment of FIG. 10, the first portion 26" of spiral coils (on first surface 18 of the PC board 12) does not exactly overlay the second portion 28" of coils (shown only in phantom via dash-hidden lines) on the second side (not visible). The coils of the second portion 28" are offset from the coils of the first portion 26" when viewed along the direction orthogonal to the PC board 12.

From the above description of the invention, those skilled in the art will perceive improvements, changes and modifications. Such improvements, changes and modifications within the skill of the art are intended to be covered by the appended claims.

Having described the invention, the following is claimed:

1. A current sensing arrangement comprising:
   a Hall effect sensor;
   a current-carrying line encircling said Hall effect sensor; and
   a ferromagnetic sheet material covering a portion of said current-carrying line and a portion of said Hall effect sensor;
   wherein said current-carrying line radially spirals around said Hall effect sensor with a plurality of spiral turns.

2. An arrangement as set forth in claim 1, wherein at least a majority of said spiral turns of said current-carrying line extend in a plane around said Hall effect sensor.

3. An arrangement as set forth in claim 1, wherein a first portion of said spiral turns of said current-carrying line spiral inward toward said Hall effect sensor and a second portion of said spiral turns of said current-carrying line spiral outward away from said Hall effect sensor.

4. An arrangement as set forth in claim 3, wherein said first portion of said spiral turns of said current-carrying line extend in a first plane and said second portion of said spiral turns of said current-carrying line extend in a second plane, and the first and second planes are parallel.

5. An arrangement as set forth in claim 1, wherein said arrangement includes an electrical insulating sheet material extending between said ferromagnetic sheet material and said portion of said current carrying line, and a sheet material retaining clip.

6. An arrangement as set forth in claim 1, wherein said ferromagnetic sheet material is made of magnetic nickel-iron alloy.

7. An arrangement as set forth in claim 1, wherein said ferromagnetic sheet material is in contact with said Hall effect sensor.

8. An arrangement as set forth in claim 1, wherein said ferromagnetic sheet material has a thickness on the order of 0.005–0.015 inches.

9. A current sensing arrangement comprising:
   means for sensing a current via magnetic field sensing and for providing an output indicative of the amount of sensed current;
   means for providing a current that encircles said means for sensing and outputs a magnetic field; and
   means for concentrating the magnetic field output from said means for providing a current to said means for sensing via transmission through a ferromagnetic sheet material;
   wherein said means for providing a current includes a line that radially spirals with a plural number of turns around said means for sensing a current.

10. An arrangement as set forth in claim 9, wherein said means for sensing a current includes means for sensing current within a range of current values related to the number of turns of said line that spirals.

11. A current sensing arrangement comprising:
   a Hall effect sensor;
   a current-carrying line encircling said Hall effect sensor; and
   a ferromagnetic sheet material covering a portion of said current-carrying line and a portion of said Hall effect sensor;
   wherein said current-carrying line spirals around said Hall effect sensor, said current-carrying line has a plurality of spiral turns around said Hall effect sensor, a first portion of said spiral turns of said current-carrying line spiral inward toward said Hall effect sensor and a second portion of said spiral turns of said current-carrying line spiral outward away from said Hall effect sensor, and said arrangement is located on a board that has a first planar surface, a second planar surface and an aperture extending through said board between said first and second surfaces, said Hall effect sensor is located within said aperture, said first portion of spiral turns of said current-carrying line is located adjacent to said first surface of said board, and said second portion of spiral turns of said current-carrying line is located adjacent to said second surface of said board.

12. An arrangement as set forth in claim 6, wherein said ferromagnetic sheet material extends to overlay across a part of said first portion of spiral turns of said current-carrying line, wraps from said first surface of said board to said second surface of said board, and extends to overlay across a part of said second portion of spiral turns of said current-carrying line.

13. A current sensing arrangement comprising:
   a Hall effect sensor;
   a current-carrying line encircling said Hall effect sensor; and
   a ferromagnetic sheet material covering a portion of said current-carrying line and a portion of said Hall effect sensor;
   wherein said arrangement includes an electrical insulating sheet material extending between said ferromagnetic sheet material and said portion of said current carrying line, and a sheet material retaining clip, and said arrangement is located on a board that has a first planar surface, a second planar surface and an aperture extending through said board between said first and second surfaces, said Hall effect sensor is located within said aperture, said current-carrying line is located adjacent to one of said first and second surfaces of said board, and said ferromagnetic sheet material and said electrical insulating sheet material wrap around said board and are held in place relative to said board, said current-carrying line and said Hall effect sensor by said sheet material retaining clip.

* * * * *